United States Patent [19]

Gardner et al.

[11] Patent Number: 5,679,585
[45] Date of Patent: Oct. 21, 1997

[54] METHOD FOR FORMING METAL SILICIDE ON A SEMICONDUCTOR SURFACE WITH MINIMAL EFFECT ON PRE-EXISTING IMPLANTS

[75] Inventors: Mark I. Gardner, Cedar Creek; Fred N. Hause, Austin; Derick J. Wristers, Austin; Dim-Lee Kwong, Austin, all of Tex.

[73] Assignee: Advanced Micro Devices, Inc., Sunnyvale, Calif.

[21] Appl. No.: 746,774

[22] Filed: Nov. 15, 1996

[51] Int. Cl.$^6$ ................................................. H01L 21/283
[52] U.S. Cl. .................... 437/41 SM; 437/200; 437/247; 437/949
[58] Field of Search ................ 437/41 SM, 190, 437/192, 200, 201, 247

[56] References Cited

U.S. PATENT DOCUMENTS

| | | | |
|---|---|---|---|
| 4,293,589 | 10/1981 | Takagi et al. | 427/93 |
| 4,845,055 | 7/1989 | Ogata | 437/247 |
| 4,923,822 | 5/1990 | Wang et al. | 437/41 |
| 5,043,300 | 8/1991 | Nulman | 437/200 |
| 5,167,716 | 12/1992 | Boitnott et al. | 118/719 |
| 5,236,868 | 8/1993 | Nulman | 437/190 |
| 5,242,860 | 9/1993 | Nulman et al. | 437/190 |
| 5,421,974 | 6/1995 | Witt | 204/192.25 |

OTHER PUBLICATIONS

Hara, T., et al., "Formation of Titanium Nitride . . . " Appl. Phys. Lett., 57(16), 15 Oct. 1990, pp. 1660–1662.

Chen, S., et al., "Formation of Titanium Nitride . . . " Japanese J. Appl. Phys., 30 (11A), Nov. 1991, pp. 2673–2678.

Kermani, A., et al., "The Effects of Processing Ambient . . . " Mat. Res. Soc. Symp. Proc. vol. 74, 1987, Mat. Res. Soc., pp. 665–672.

*Primary Examiner*—T. N. Quach
*Attorney, Agent, or Firm*—Kevin L. Daffer; Conley, Rose & Tayon

[57] ABSTRACT

An method is provided for fabricating a metal silicide upon a semiconductor topography. The method advantageously performs the anneal cycles at a substantially lower temperature. By employing a high pressure anneal chamber, temperature equilibrium is achieved across the semiconductor topography and especially in small silicide formation areas. The higher pressure helps ensure thermal contact of heated, flowing gas across relatively small geometries in which silicide is to be formed. Substantial metal silicide formation can occur at the higher pressures even under relatively lower temperature conditions. The lower temperature process helps ensure that pre-existing implant regions remain at their initial position. The present metal silicide process and lower temperature anneal is therefore well suited to avoid impurity migration problems such as, for example, threshold skew, parasitic junction capacitance enhancement, and gate oxide degradation.

24 Claims, 4 Drawing Sheets

METHOD FOR FORMING METAL SILICIDE ON A SEMICONDUCTOR SURFACE WITH MINIMAL EFFECT ON PRE-EXISTING IMPLANTS

BACKGROUND OF THE INVENTION

1. Field of the Invention

This invention relates to integrated circuit manufacture and more particularly to the fabrication of a metal silicide under lower temperature conditions.

2. Description of the Related Art

Fabrication of an integrated circuit involves numerous processing steps. After impurity regions have been deposited within a semiconductor substrate and gate areas defined upon the substrate, interconnect routing is placed on the semiconductor topography and connected to contact areas thereon to form an integrated circuit. The entire process of making an ohmic contact to the contact area and routing interconnect material between ohmic contacts is generally described as "metalization." While materials other than metals are often used, the term metalization is generic in its application and is derived from the origins of interconnect technology, where metals were the first conductors used. As the complexity of integrated circuits has increased, the complexity of metalization construction and composition has also increased.

In order to form highly conductive ohmic contacts in the connecting region to which the overlying interconnect (generally aluminum) is routed, it is often times necessary to incorporate a layer of refractory metal as part of the metalization scheme. The refractory metal, when subjected to high enough temperature, reacts with silicon to form what is commonly called a "silicide". Silicides are well known in the art and provide an area in which a dependable silicon contact with low ohmic resistance is formed.

Silicides have gained in popularity as a mechanism for reducing resistance of highly resistive interconnect, such as polysilicon. Thus, silicides are often employed on the upper surface of a polysilicon gate conductor, the result of which is termed "polycide". The combination of silicide and polysilicon helps reduce the overall resistance of the polysilicon conductor thereby enhancing integrated circuit performance. As the polysilicon conductor shrinks in dimension, the necessity for employing a polycide becomes critical. Along with polysilicon shrinkage, the contact regions and underlying source/drain dopant areas are also scaled downward in most modem VLSI technologies. A portion of the silicides formed at the juncture between the aluminum interconnect and the underlying dopant silicon help reduce critical contact resistance, which if not reduced might approach the overall propagation delay of a single stage MOS device.

There are three popular ways in which to form a silicide, which is defined to include a polycide. According to one technique, a pure metal is deposited across the upper topography which includes exposed silicon areas (either single crystalline or polycrystalline silicon). Thereafter, the metal is reacted with the silicon to form what is known as a first phase, metal-rich silicide. The non-reacted metal is then removed, and the pre-existing first phase product is then reacted again with the underlying silicon to form a second phase, silicon-rich silicide. A second technique involves co-evaporation of both metal and silicon onto the exposed silicon topography. Both metal and silicon are thereby vaporized by, for example, an electron beam. The vaporized product is then drawn onto the wafer topography and, more specifically, across the silicon topography of interest. A third technique involves co-sputtering both metal and silicon onto the silicon surface. Co-sputtering entails physically dislodging metal and silicon materials from a composite target or separate targets, and then directing the composite material onto the wafer. Sintering may be needed to alloy or "mix" the metal and silicon product as a silicide on the underlying silicon.

Each of the above three popular techniques have certain advantages, however, it is the first technique which is of present interest. The first technique of depositing a metal and then reacting that metal with the underlying silicon involves certain advantages in which the other techniques cannot achieve. For example, the principles behind depositing a pure metal onto a semiconductor topography are generally well understood given the repetitive nature by which metal deposition processes are used in conventional semiconductor processes. Still further, it is generally known that the silicide formed as a result of reacting the metal with the underlying silicon yields a lower resistivity than the other techniques. This is due in part to the ability to more closely control that reaction process rather than having to rely upon co-evaporation or co-sputtering techniques and the contamination arising therefrom.

If the advantages of the first technique are to be realized, it is necessary that the reaction between the metal layer and the underlying silicon be carefully controlled. For that reason, conventional silicide formation steps involve two reaction cycles. Those cycles are generally referred to as "anneal" cycles. Once the metal is deposited onto silicon, a first anneal step is used to produce the first phase, metal-rich product. The first anneal step typically involves exposing the metal layer to a temperature between 500° C. and 700° C. The metal layer which does not react with underlying silicon is then removed using various well known wet etch processes in readiness for a second anneal step. The second anneal step is carried forth at a higher temperature in order to convert the first phase product into a second phase, silicon-rich silicide. The two-step anneal process is generally well documented as one of the more popular silicide formation techniques as described in, for example, U.S. Pat. Nos. 5,043,300; 5,236,868; and, 5,242,860 (herein incorporated by reference).

The need for employing two stages of anneal is primarily dictated by (i) the need to avoid reacting the metal to underlying oxide, and (ii) the need to lessen resistivity by incorporating additional silicon atoms hate the silicide. The first anneal cycle is performed at a lower temperature so as not to react the metal to underlying oxide which exists in the field regions between contacts as well as the spacer region between contact and the upper polysilicon surface. Thus, in a self-aligned silicide ("salicide") process, it is imperative that the highly reactive metal layer not react in these critical regions, for if the metal layer does react problems such as bridging or isolation shorting may occur. Bridging, resulting from, e.g., silicon migration or the reduction of silicon dioxide in adjacent oxide areas, is to be avoided if at all possible. Thus, the maximum temperature of the first anneal phase is determined to be just below the reaction temperature of metal to underlying oxide (or below the temperature level which would contribute to bridging), and that is generally known to be approximately 400° C. to 700° C. depending upon the metal used. Since the metal is a refractory metal and since a popular refractory metal is titanium, it is known that titanium reacts to underlying oxide at temperatures generally above 650° C. Thus, in instances where titanium is the metal being deposited, the first anneal phase temperature typically ranges at approximately 650° C.

However, at 650° C., adequate sheet resistance of the ensuing silicide often cannot be achieved.

The first anneal step serves only to reduce some reacted product at the juncture where the metal contacts silicon but not where the metal contacts oxide. This reacted product is retained while all non-reacted product is removed. The removal step is therefore interposed between the first anneal step and a subsequent second anneal step. Thus, the second anneal step (or second anneal phase) is applied only to the first phase product residing on silicon so as to convert the metal-rich silicide thereof into a silicon-rich silicide. The second phase, silicon-rich product is therefore a metal disilicide in approximately stoichiometric proportions. The second anneal phase is carried out in a temperature substantially higher than the first anneal phase and generally ranges between 750° C. and 950° C., depending upon the metal used. For example, if titanium is used, the second anneal temperature is approximately 800° C. to 900° C.

While the first silicide formation technique has many advantages, one limitation is dopant segregation and migration resulting from the relatively high temperature anneal phases. The metal silicide is formed by reacting the metal layer with the silicon after the dopants are in place, subjecting the source/drain and polysilicon dopants to relatively high anneal temperatures causing those dopants to move from their initial position. Using the polysilicon example, exposing the polysilicon dopants to high temperatures may cause the dopants to move from the polysilicon down into the gate oxide and possibly below the gate oxide into the channel region. Movement of boron downward into the gate oxide and channel region is often referred to as boron penetration. This problem is prevalent when the dopant within the polysilicon is a p-type dopant, such as highly mobile boron. Another problem might occur if the source/drain dopants move from their initial position within the substrate either laterally or vertically. Lateral movement may cause a reduction in effective gate length, leading to possible short channel effects ("SCE"). Vertical movement of the source/drain dopant may increase the parasitic capacitance of the junction area which can reduce the overall circuit speed.

It would therefore be desirable to undertake a metal silicide process which utilizes the first technique outlined herein above, but at a substantially lower temperature than conventional anneal cycles. Reducing the anneal temperatures, however, requires careful attention be paid to ensure adequate thermal equilibrium across the semiconductor topography and especially in the silicon areas where silicide is to be formed. Inadequate thermal equilibrium and mismatch between heated bodies in the critical areas can deleteriously reduce the ensuing silicide conductivity and uniformity in small geometric contact regions. This problem presents itself especially if the advantages of lower anneal temperatures are carried out.

SUMMARY OF THE INVENTION

The problems outlined above are in large part solved by a silicide fabrication process of the present invention. That is, the silicide process hereof achieves lower temperature anneal cycles than conventional silicide processes which employ pure metal deposition followed by metal/silicon reaction (i.e. the first silicide technique). The lower temperature anneals beneficially minimize segregation and migration of pre-existing implant species found in the silicon substrate and overlying polysilicon conductors. Accordingly, the present silicide process serves to minimize threshold skews, capacitance enhancements, gate oxide degradation and SCE, for example.

Temperature reduction is achieved by utilizing, according to one embodiment, a temperature equalization step. More specifically, the present process avoids use of rapid thermal anneal (RTA), the equipment and the problems thereof. A high pressure furnace is used. The furnace is active for a sufficient time necessary to ensure the ambient gas surrounding the wafer is of the same temperature as the silicon, the metal layer overlying the silicon, and the junction therebetween. Thermal equilibrium hereof is therefore used in conjunction with all the various films, substrate and implanted areas within the substrate and overlying films to present uniform temperature in critical, small dimension areas. Those areas are generally those which receive a silicide. The thermal equilibrium brought about by a furnace with pressurized ambient gas allows superior thermal exchange from the gas to those small geometric areas.

Either one or both of the anneal cycles are carried out in a furnace having a pressurized ambient contained within the furnace and surrounding the exposed wafer surface. The pressurized condition and lengthy heating cycle brought about by the high pressure furnace is postulated to help "drive" the thermal carrying gas evenly across small, critical areas such as modem day source/drain junctions. Sufficient pressure in these small-dimensioned areas over a sufficient amount of time, much longer than time afforded by RTA, helps ensure thermal equilibrium of not only the metal layer on the silicon surface by also the nitridation species upon the metal layer. The nitradation species, generally an inert species, helps control the bottom-side silicidation of the metal layer which occurs during the first anneal phase. Nitradation also minimizes ingress of contaminants into the growing metal silicide, such contaminants being, for example, oxygen.

Broadly speaking, the present invention contemplates a method for fabricating a metal silicide contact region upon a semiconductor topography which comprises a substrate dopant region and a polysilicon region. A metal layer is deposited upon the semiconductor topography to form a metal coated topography. The wafer which bears the metal coating is then placed into an annealing chamber. Thereafter, an inert gas placed within the annealing chamber is pressurized to a pressure which exceeds 2.0 atmospheres during which time the metal coated topography is heated to a temperature less than 550° C. to form a first metal silicide (i.e., a metal-rich silicide). The length of time in which the wafer is exposed to the anneal temperature depends on the temperature used; however, in most cases the anneal temperature exceeds that used by a KTA process. The duration of the high temperature anneal cycle can be extended if additional reaction is needed. Additional reaction and added anneal times could be used in, for example, a second anneal cycle where lower resistivity product is desired. Thus, the first metal silicide is followed by pressurizing the inert gas again to a pressure which exceeds 2.0 atmospheres while heating the first metal silicide to a temperature less than 750° C. to form a second metal silicide (i.e., a silicon-rich silicide). The second metal silicide is formed having a second resistivity which is less than the first resistivity of the first metal silicide.

The present invention further contemplates a method for forming a conductive contact to an electronic device. A semiconductor topography is provided having an isolated silicon region to be contacted. A metal layer is then formed within a sputter chamber across the silicon region. The metal coated silicon is removed from the sputter chamber and placed into an annealing chamber. The annealing chamber receives an ambient gas at a pressure greater than 2.0 atmospheres. The annealing chamber is heated along with the ambient gas which surrounds the wafer. The heated temperature is less than approximately 550° C. to form a first metal silicide of first resistivity upon the silicon region. Portions of the metal layer which do not react during the first anneal phase are then removed from the metal layer subsequent that anneal phase.

According to one preferred embodiment, the atmospheric pressure within the anneal chamber, or specifically the inert, ambient gas against the wafer topography exceeds 2.0 atmospheres. According to another preferred embodiment, the pressure exceeds 5.0 atmospheres during both the first and second anneal phases. According to yet another preferred embodiment, the pressure exceeds 10.0 atmospheres during both the first and second anneal phases. According to still another preferred embodiment, the pressure exceeds 5.0 atmospheres during a the first phase and exceeds 10.0 atmospheres during the second anneal phase.

BRIEF DESCRIPTION OF THE DRAWINGS

Other objects and advantages of the invention will become apparent upon reading the following detailed description and upon reference to the accompanying drawings in which.

Figure 1:
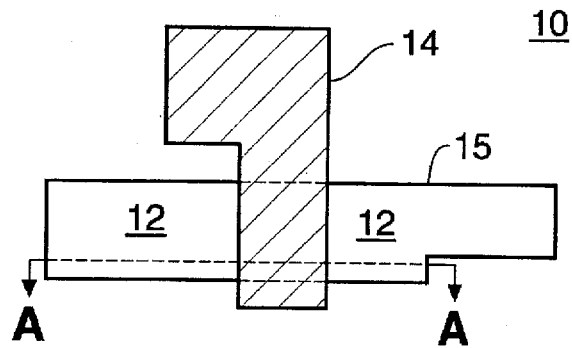
FIG. 1 is a top plan view of an MOS transistor having dopant regions and a polysilicon region placed within and upon a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to FIG. 1, circuit topography of a semiconductor substrate is shown. The topography includes an MOS transistor (either a p-type or n-type transistor) using self-aligned polysilicon gate 14 placed above an active diffusion or implantation area 15. Active area 15 includes areas upon substrate 10 void of field oxide. Active area 15 includes impurity regions or source/drain regions 12 aligned with the edges of polysilicon gate 14.

Figure 2:
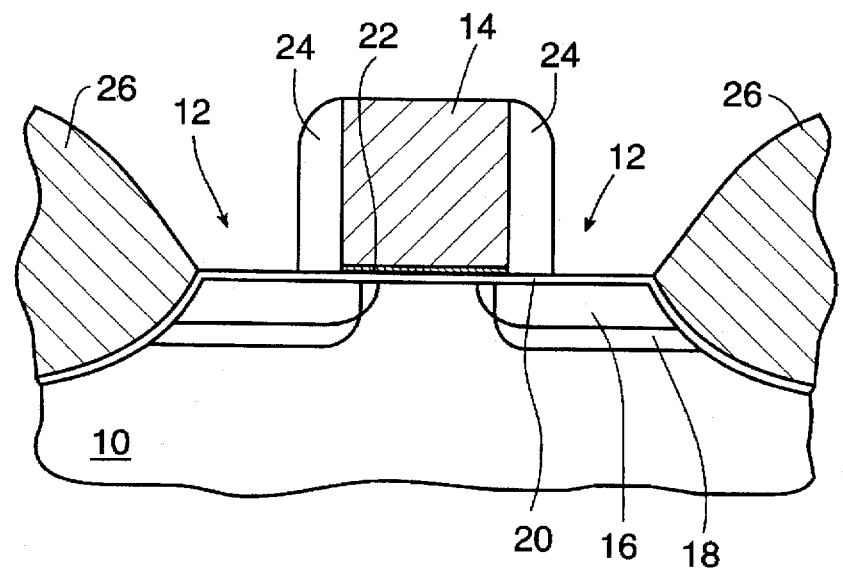
FIG. 2 is a cross-sectional view of along plane A—A of FIG. 1 showing an MOS transistor partially fabricated during a processing step according to the present invention.

FIG. 2 illustrates a cross-sectional view along plane A—A of FIG. 1. It is appreciated from the present drawings that a metalization layer (not shown) can be placed on the upper surface of the substrate topography and brought in contact with various silicides located upon that topography. Contact can be had to underlying silicon (single crystal silicon or polycrystalline silicon). For sake of clarity, overlying metalization layers and subsequent processing steps are not shown. However, it is understood that the silicide process hereof, is purposefully used to provide high quality ohmic contact of metalization.

FIG. 2 illustrates MOS processing using lightly doped drain (LDD) technology necessary to form various implant regions, such as LDD implant 16, source/drain implant 18, and threshold adjust/channel stop implant 20. Formed at the upper surface of substrate 10 is a patterned polysilicon 14 overlying a thin gate oxide 22. Laterally spaced from, and adjacent to, polysilicon 14 are sidewall spacers 24, which inter alia, help to prevent problems such as SCE and hot carrier injection.

It is understood that field oxide 26 can be formed in various ways. For example, field oxide 26 can arise from localized oxidation, or "LOCOS". Under the LOCOS process, field oxide 26 can extend upward from the silicon surface as shown in FIG. 2. Alternatively, field oxide 26 can arise from a shallow trench process, or "STI". Under STI, fill oxide is placed into a trench and thereafter planarized to complete the field oxide. It is within the spirit of the present disclosure that oxide 26 be formed by either method depending upon the amount of upper topological planarization desired.

Figure 3:
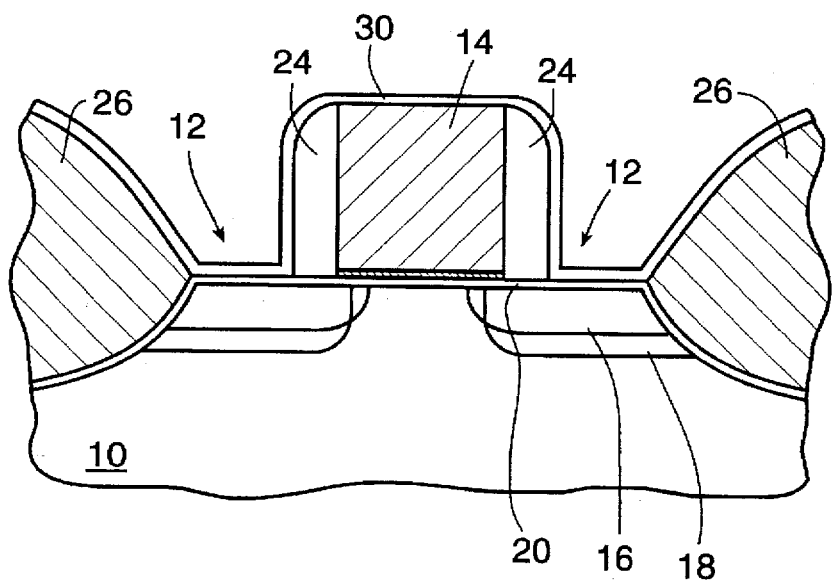
FIG. 3 is a cross-sectional view along plane A—A of FIG. 1 showing a processing step subsequent to FIG. 2, wherein a refractory metal is deposited upon the MOS transistor upper topography according to the present invention.

Referring to FIG. 3, a cross-sectional view along plane A—A of FIG. 1 is shown during a processing step subsequent to FIG. 2. A refractory metal layer 30 is deposited across the exposed upper surface. That upper surface comprises field oxide 26, LDD/source and drain substrate regions 18/16, spacer 24 and polysilicon 14. Refractory metal 30 can be deposited in numerous ways, a suitable technique being sputter deposition. Alternatively, metal 30 can be deposited using chemical vapor deposition or evaporation, if desired. A suitable refractory metal 30 comprises titanium sputter deposited from a titanium target (source) onto the upper surface of a wafer placed within the sputter chamber. If titanium is used, it is desired that the anneal temperatures relate to anneal characteristics of titanium at the titanium/silicon juncture.

Figure 4:
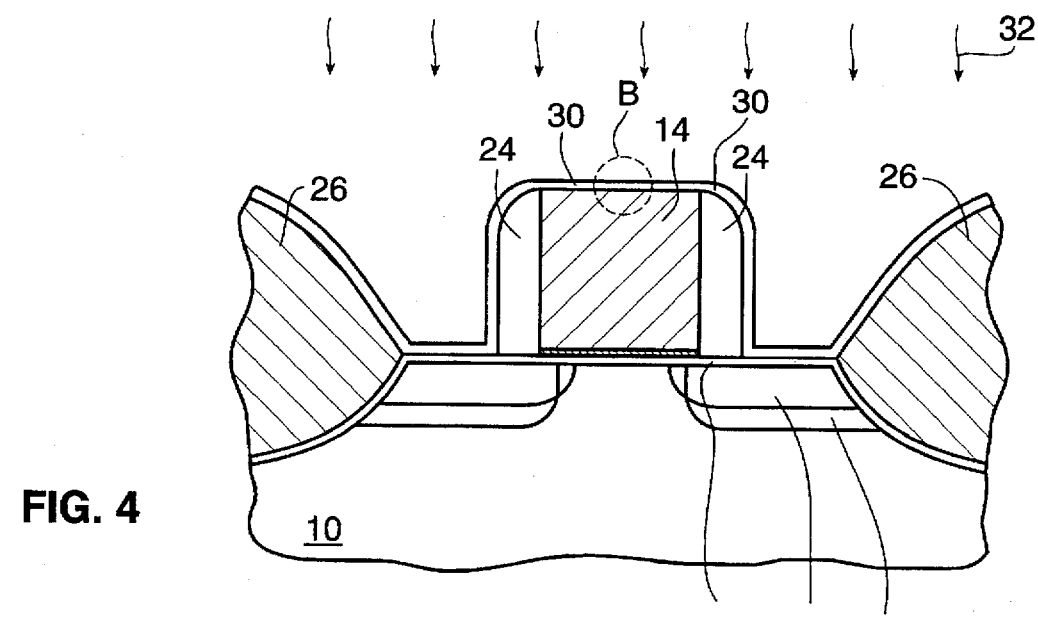
FIG. 4 is a cross-sectional view along plane A—A of FIG. 1 showing a processing step subsequent to FIG. 3, wherein the refractory metal undergoes reaction with underlying silicon during a first anneal phase according to the present invention.

Referring to FIG. 4, a subsequent processing step is shown in which metal layer 30 is subjected to a temperature cycle 32. Temperature cycle 32 is defined as a first anneal phase in which an ambient gas is drawn across the upper surface of metal layer 30. The ambient gas is heated along with the wafer containing the elements shown in FIG. 4. The temperature at which the first anneal phase occurs for a titanium metal layer 30 is less than 550° C. This first anneal phase, and the temperature used in performing the first anneal phase, is chosen to react metal 30 only with underlying silicon and not with silicon dioxide ("oxide"). The first anneal phase is purposefully carried out in a furnace for a time sufficient to equalize the temperature of gas and solid substances within the diffusion furnace. In order to gain sufficient thermal equalization, anneal is carried out in a diffusion furnace, as opposed to a rapid thermal anneal (RTA) chamber. In lieu of using an RTA, and the unequalized temperature gradient resulting from an RTA, the present temperature cycle is not performed in a rapid manner. Instead, the present anneal phase is carded out over a time which exceeds in most instances several minutes, e.g., 15 or 30 minutes in some instances depending upon the amount of reaction needed and the temperature chosen. If the anneal temperature is low and more reaction is needed, then the pressure within the diffusion furnace and the time duration (i.e., exposure) can be increased. Thus, the diffusion furnace is sealed so that it can be pressurized to levels exceeding 2.0 atmospheres according to one embodiment, exceeding 5.0 atmospheres according to another embodiment, and possibly exceeding 10.0 atmospheres (up to, for example, 25.0 atmospheres) according to yet a further embodiment.

Figure 5:
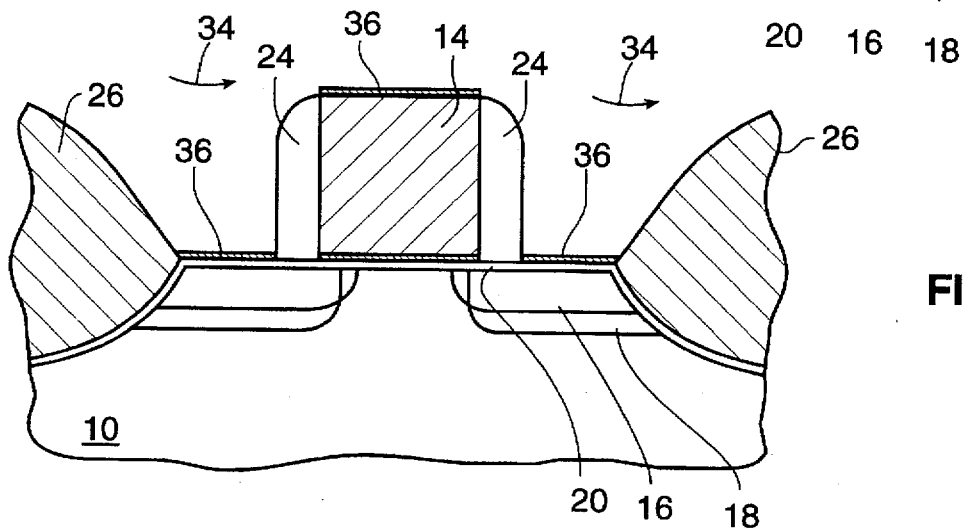
FIG. 5 is a cross-sectional view along plane A—A of FIG. 1 showing a processing step subsequent to FIG. 4, wherein non-reacted portions of the metal are removed according to present invention.

FIG. 5 illustrates a processing step subsequent to FIG. 4, wherein the semiconductor topography is removed from the chamber which performs the first anneal phase and placed within an etchant environment. Preferably, the etchant is a wet etchant comprising hydrogen peroxide, ammonium hydroxide and deionized water. The etchant material 34 is shown in FIG. 5 as being used to remove metal which does not react during the first anneal phase of FIG. 4. The reacted metal-rich silicide 36 is retained upon polysilicon 14 as well as on the silicon contact areas interposed between LDD and source/drain implants 16 and 18.

Figure 6:
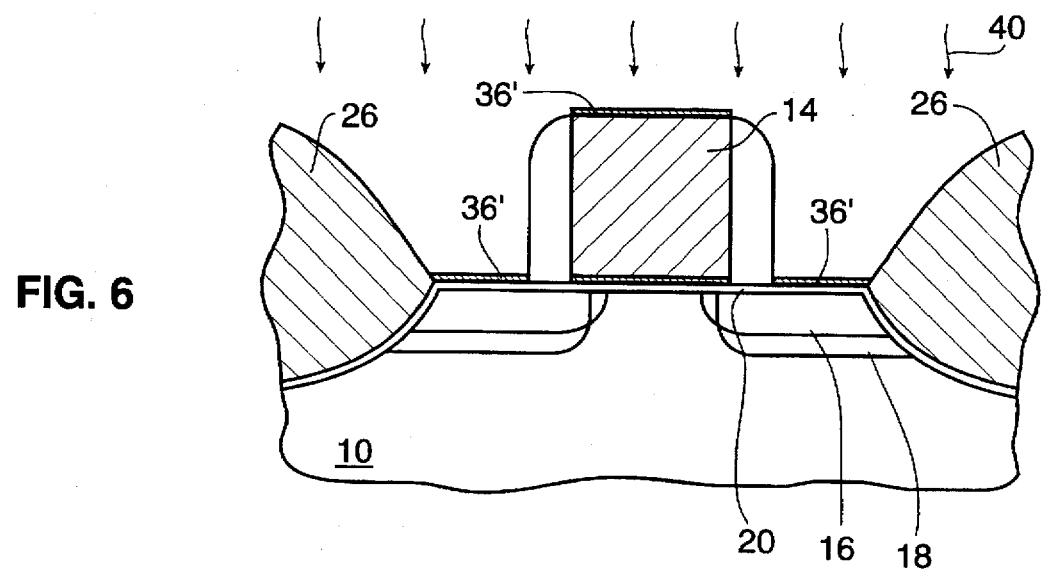
FIG. 6 is a cross-sectional view along plane A—A of FIG. 1 showing a processing step subsequent to FIG. 5, wherein reacted portions of the metal undergo a second anneal phase according to the present invention.

After selectively removing the unreacted silicide, a stabilization anneal phase is performed as shown in FIG. 6. The stabilization anneal phase or second anneal phase occurs at a somewhat higher temperature, yet less than the conventional second anneal phase temperature. The preferred temperature at which second anneal 40 occurs is less than 750° C. when titanium is chosen as the refractory metal.

The second anneal phase shown in FIG. 6 is performed at a pressure which exceeds 2.0 atmospheres, and preferably 5.0 atmospheres, or 10.0 atmospheres depending on the amount of pressurization needed. The metal silicide formed as a result of the second anneal 40 is shown as reference numeral 36'. Silicide 36' is defined as a second metal silicide (or second phase product comprising silicon-rich silicide.) The second metal silicide 36' results in a second sheet resistance less than the first sheet resistance of first metal silicide 36.

Figure 7:
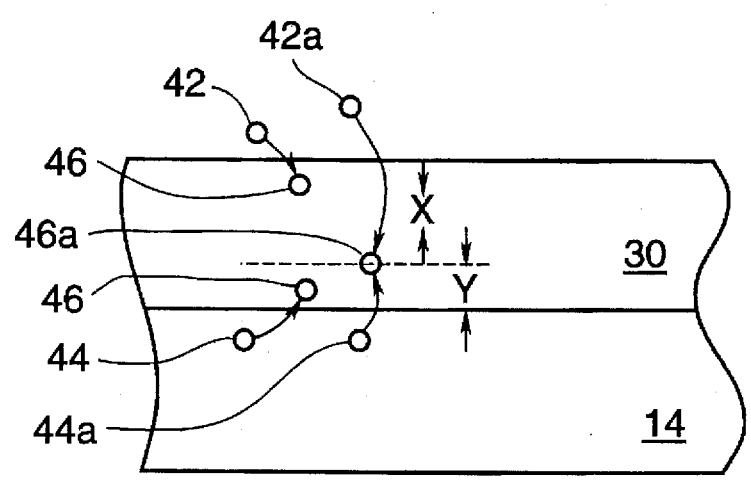
FIG. 7 is an atomic view along detail area B of FIG. 4.

Referring to FIG. 7, a detailed view along area B of FIG. 4 is provided. The detailed view represents an atomic level illustration of the ambient gas being an inert gas or, according to one example, a nitrogen-bearing gas. Nitrogen atoms 42 within the nitrogen-bearing gas migrate into metal layer 30 as a result of anneal. The atomic implications of anneal and the effect upon metal layer 30 is shown. Metal layer 30 is sandwiched directly between polysilicon 14 and the overlying nitridation species. The nitradation species can occur from a nitrogen-bearing ambient or from a metal nitride layer deposited upon metal layer 30. During silicidation, as brought about by the first anneal phase, silicon atoms 44 migrate or move from polysilicon 14 to bond with metal atoms 46 contained within metal layer 30. At the same time, nitrogen atoms 42 move from the overlying nitrogen source to bond with metal atoms 46 within metal layer 30. The density of atomic nitrogen 42 is controlled by defining the nitrogen content of the gas species or the nitrogen content of an overlying metal nitride material such that an abundance free non-bonded nitrogen atoms 42 exist. The propensity for nitrogen atoms to move to metal bond sites 46, and the relative mobility of nitrogen in relation to silicon, allows nitrogen to penetrate deeper within layer 30 than silicon from layer 14. As such, silicon atom 44a is blocked from bonding to metal atom 46a due to the occurrence of a pre-existing bond of nitrogen atom 42a within metal atom 46a. This is caused by the higher mobility of nitrogen and the lower bond strength between nitrogen. Accordingly, the depth of silicide formation is closely controlled by the concentration of nitrogen within the nitrogen-bearing gas or overlying metal 30. Bonded nitrogen and metal atoms occur predominantly throughout a first distance X into metal layer 40, as measured from metal layer 30 upper surface. Likewise, silicon atoms bond with metal atoms a second distance Y as measured from the silicon or polysilicon layer upper surface. The bonded nitrogen and metal atoms cause silicon atoms to substantially cease movement into metal layer 30 after the silicon atoms move a distance Y into the metal layer. Distance Y is equal to the thickness of the metal layer minus distance X, and preferably distance X is greater than distance Y. The nitridation and silicidation process is shown along the polysilicon surface, however, the process also applies along the silicon (source/drain) surface. In whatever region the nitridation and silicidation occurs, the atomic-level depiction of FIG. 7 is provided to help explain how anneal hereof works and the byproduct resulting from anneal.

Figure 8:
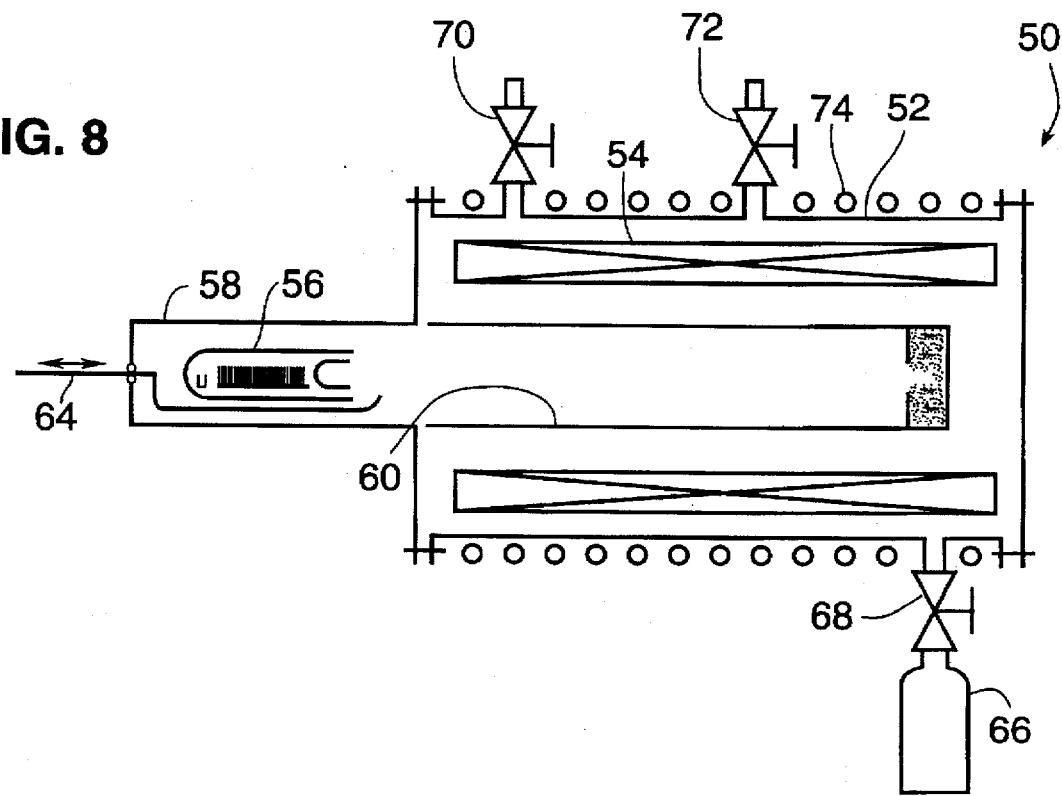
FIG. 8 is a schematic sectional view of a high pressure furnace used to perform first and second anneal phases according to the present invention.

Referring to FIG. 8, a high pressure anneal apparatus 50 is shown. Apparatus 50 includes a pressure chamber 52, a furnace 54 arranged in the pressure chamber 52, and a quartz capsule 56 configured to be inserted into chamber 52. Capsule 56 can receive possibly numerous wafers having exposed surfaces upon which silicide can be formed. Pressure chamber 52 is provided with a loader portion 58 such that capsule 56 can be inserted into tube 60 inside of furnace 54 by a loader red 64. Furnace 54 heats capsule 56 and, simultaneously, pressure of gas from source 66 is applied around capsule 56 and the wafers contained therein.

Pressures within chamber 52 can be maintained substantially higher than atmospheric pressure, and in a preferred instance greater than 2.0, 5.0 or even 10.0 atmospheres. Pressure is regulated by valve 68, as well as valve 70 and 72. The temperature can also be regulated by cooling coils 74 arranged about the outside surface of pressure chamber 52. The cooling coils, in conjunction with heater 54, regulate the temperature within chamber 60 possibly in accordance with pressure. Examples of high pressure chambers are provided in reference to U.S. Pat. Nos. 4,293,589 and 5,167,716 (herein incorporated by reference). According to conventional techniques, however, high pressure furnaces are generally employed in order to oxidize regions on a silicon substrate, and are most often used to produce field oxides. See, e.g. Wolfe, Silicon Processing for the VLIS Era—Vol. 1, (Lattice Press, 1986), pp. 216–219 (herein incorporated by reference). While conventional oxidation processes employ high pressure oxidation systems, those systems are limited only to the oxidation step and are not generally employed in process steps where oxidation is not needed and, purposefully must not be employed—i.e. during salicidation hereof. Thus, high pressure chambers used in oxidation cannot be easily retrofitted to avoid oxidation introduction for the benefit of an altogether different processing step used to produce a low temperature silicide as set forth in the spirit and scope of the present claimed invention. The high pressure anneal chamber 50 is, however, a chamber retrofitted from a conventional furnace but which can withstand higher internal pressures of preferably an ambient gas.

Figure 9:
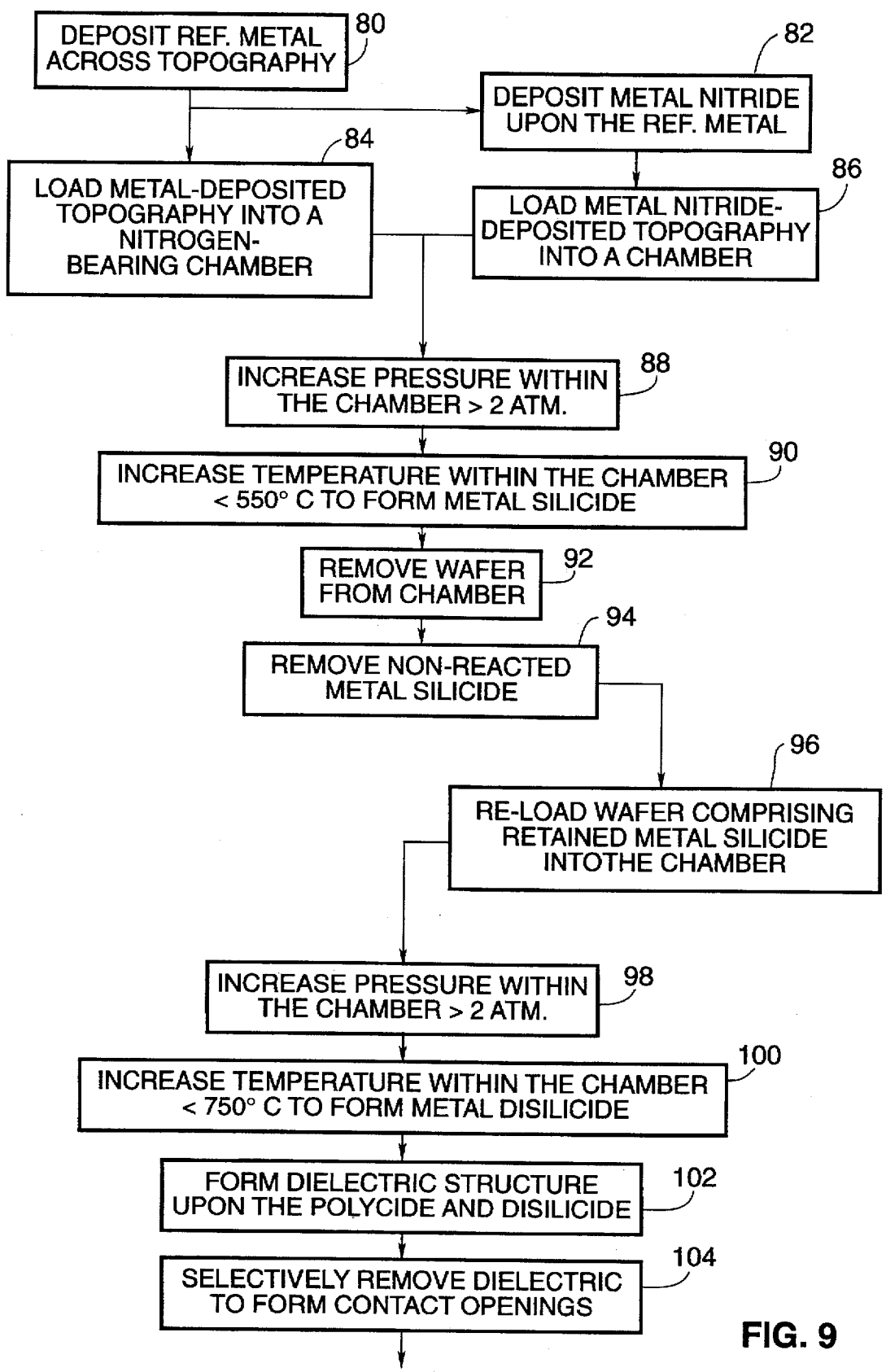
FIG. 9 is a flow diagram of the metal silicide process sequence according to the present invention.

Referring to FIG. 9, a processing sequence for achieving metal silicide under low temperature conditions is illustrated. The processing sequence begins by depositing a refractory metal across a semiconductor topography 80. The topography includes a silicon-bearing material (single crystal silicon or polycrystalline silicon). Once the refractory metal layer is established, a metal nitride layer can then be deposited thereon 82, or, alternatively, the metal-deposited topography can be directly loaded into a nitrogen-bearing anneal chamber 84. The metal nitride-deposited topography can also be loaded into the anneal chamber 86. Regardless of the topography chosen: metal nitride or metal, the first anneal phase begins by increasing the pressure within the anneal chamber 88 while increasing temperature within the chamber as well. The result of the enhanced pressure is to lower the overall temperature needed to affect a metal silicide. Both steps are shown as reference numeral 88 and 90.

Once the first anneal phase is completed, the wafer is removed from the anneal chamber 92 and deposited into an etch material for removing non-reacted metal silicide 94. Thereafter, the remaining metal silicide is re-loaded into the anneal chamber 96 so that a second anneal phase can occur.

The second anneal phase begins by increasing the pressure within the anneal chamber while increasing temperature to a level below 700° C. but preferably above 550° C. The pressurization and temperature steps are shown as reference numerals 98 and 100. Resulting from the second anneal phase, a silicon-rich metal silicide (e.g., disilicide) is formed upon which a dielectric structure can be deposited and thereafter selectively removed to form contact openings, as shown by reference numerals 102 and 104. The preferred dielectric structure includes a CVD dielectric such as CVD oxide. The interconnect is then deposited across the interlevel dielectric and down into the openings formed through the interlevel dielectric and to the metal silicide.

It will be appreciated to those skilled in the art having the benefit of this disclosure that this invention is believed to be capable of applications with numerous silicidation schemes upon vastly dissimilar silicon substrate topographies. Moreover, it is also to be understood that the form of the invention shown and described is to be taken as exemplary, presently preferred embodiments. Various modifications and changes may be made without departing from the spirit and scope of the invention as set forth in the claims. An exemplary modification might be one which uses refractory metals other than titanium, or which avoids use of LDD spacers. Any density spaced plurality of regions, requiring close control of silicide formation thereon, fall within the spirit and scope of the invention as defined by the claims. It is intended that the following claims be interpreted to embrace all such modifications and changes.

What is claimed is:

1. A method for fabricating a metal silicide region upon a semiconductor topography, comprising:

providing a semiconductor substrate upon which a semiconductor topography is formed, said topography comprises a substrate dopant region and a polysilicon region configured across a portion of said topography;

depositing a metal layer upon said semiconductor topography to form a metal coated topography;

placing said metal coated topography into an annealing chamber;

annealing said metal coated topography by pressurizing an inert gas within said annealing chamber to a pressure which exceeds 2.0 atmospheres while heating said metal coated topography to a temperature less than 550° C. to form a first metal silicide of first resistivity upon said substrate dopant region and said polysilicon; and further annealing said first metal silicide by pressurizing an inert gas within said annealing chamber to a pressure which exceeds 2.0 atmospheres while heating said first metal silicide to a temperature less than 750° C. to form a second metal silicide of second resistivity less than said first resistivity upon said substrate dopant region and said polysilicon.

2. The method as recited in claim 1, wherein said metal layer comprises refractory metal.

3. The method as recited in claim 1, wherein said metal layer comprises titanium.

4. The method as recited in claim 1, wherein said dopant region comprises a source or drain region of a MOS transistor.

5. The method as recited in claim 1, wherein said depositing comprises sputter depositing within a sputter chamber.

6. The method as recited in claim 5, further comprising:
without removing said metal coated topography from said sputter chamber, forming a metal nitride layer upon said metal coated topography prior to said annealing.

7. The method as recited in claim 6, wherein said without removing comprises retaining said metal coated topography within said sputter chamber and forming said metal nitride layer without intervening exposure of said metal layer to an oxygen-containing or moisture-containing atmosphere.

8. The method as recited in claim 1, further comprising removing a layer of non-reacted metal from said metal layer subsequent to said annealing.

9. The method as recited in claim 1, further comprising removing a layer of non-reacted metal from said metal layer prior to said further annealing.

10. The method as recited in claim 1, wherein said inert gas comprises nitrogen.

11. The method as recited in claim 10, wherein said annealing comprises moving nitrogen atoms from said inert gas simultaneous with silicon atoms moving from said substrate dopant region and said polysilicon, wherein said nitrogen atoms are moved into said metal layer and bond with metal atoms contained therein, and wherein said bonded nitrogen and metal atoms control distance of movement of said silicon atoms into said metal layer.

12. The method as recited in claim 11, wherein a majority of said nitrogen atoms are present within a first distance x as measured from the upper surface of said metal layer, and a majority of said silicon atoms are present within a second distance y as measured from the lower surface of said metal layer.

13. The method as recited in claim 12, wherein distance x is greater than distance y.

14. The method as recited in claim 1, wherein said pressure exceeds 5.0 atmospheres during said annealing and further annealing steps.

15. The method as recited in claim 1, wherein said pressure exceeds 10.0 atmospheres during said annealing and further annealing steps.

16. The method as recited in claim 1, wherein said pressure exceeds 5.0 atmospheres during said annealing step and exceeds 10.0 atmospheres during said further annealing step.

17. A method for forming a conductive contact to an electronic device, comprising:

providing a semiconductor topography having an isolated silicon region to be contacted;

forming within a sputter chamber a metal layer across said silicon region;

loading the metal coated silicon region into an annealing chamber;

inserting an ambient gas at a pressure greater than 2.0 atmospheres into said annealing chamber and heating said chamber to a temperature less than 600° C. to react a portion of said metal layer as a first metal silicide of first resistivity upon said silicon region; and removing a non-reacted portion of said metal layer from said metal layer subsequent to said annealing.

18. The method as recited in claim 17, wherein said metal layer comprises refractory metal.

19. The method as recited in claim 17, wherein said region comprises single crystalline silicon or polycrystalline silicon.

20. The method as recited in claim 17, further comprising:

without removing said metal coated areas from said sputter chamber, forming a metal nitride layer upon said metal coated area prior to said inserting.

21. The method as recited in claim 17, wherein said ambient gas comprises nitrogen.

22. The method as recited in claim 21, wherein said inserting comprises moving nitrogen atoms from said ambient gas simultaneous with silicon atoms moving from said silicon region, wherein said nitrogen atoms are moved into said metal layer and bond with metal atoms contained therein, and wherein said bonded nitrogen and metal atoms control distance of movement of said silicon atoms into said metal layer.

23. The method as recited in claim 17, further comprising:

reloading said first metal silicide formed upon said silicon region into said chamber; and reinserting said ambient gas at a pressure greater than 2.0 atmospheres into said chamber and heating said chamber to a temperature less than 750° C. to transform said first metal silicide into a second metal silicide of second resistivity less than said first resistivity upon said silicon area.

24. The method as recited in claim 17, wherein said first metal silicide comprises TiSi and wherein said second metal silicide comprises $TiSi_2$.

* * * * *